(12) United States Patent
Meguro et al.

(10) Patent No.: US 7,771,693 B2
(45) Date of Patent: *Aug. 10, 2010

(54) DIAMOND SINGLE CRYSTAL SUBSTRATE MANUFACTURING METHOD

(75) Inventors: Kiichi Meguro, Itami (JP); Yoshiyuki Yamamoto, Itami (JP); Takahiro Imai, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/192,515

(22) Filed: Aug. 15, 2008

(65) Prior Publication Data

US 2008/0311024 A1    Dec. 18, 2008

Related U.S. Application Data

(62) Division of application No. 11/032,176, filed on Jan. 11, 2005, now Pat. No. 7,481,879.

(30) Foreign Application Priority Data

| Jan. 16, 2004 | (JP) | ............................. 2004-009047 |
| Mar. 22, 2004 | (JP) | ............................. 2004-081815 |
| Nov. 5, 2004 | (JP) | ............................. 2004-322048 |

(51) Int. Cl.
*B01J 3/06* (2006.01)

(52) U.S. Cl. ........................................ 423/446; 117/84

(58) Field of Classification Search ................. 423/446; 117/84, 88, 94, 97
See application file for complete search history.

(56) References Cited

U.S. PATENT DOCUMENTS

| 5,127,983 A | 7/1992 | Imai et al. |
| 5,366,298 A | 11/1994 | Toshimitsu et al. |
| 5,380,516 A | 1/1995 | Tanabe et al. |
| 5,387,310 A | 2/1995 | Shiomi et al. |
| 5,427,054 A | 6/1995 | Saito et al. |
| 5,474,021 A | 12/1995 | Tsuno et al. |
| 5,491,028 A | 2/1996 | Sarin et al. |
| 5,527,565 A | 6/1996 | Nam et al. |
| 5,677,372 A | 10/1997 | Yamamoto et al. |
| 5,743,957 A | 4/1998 | Kobashi |
| 5,753,038 A * | 5/1998 | Vichr et al. ................... 117/97 |
| 6,162,412 A | 12/2000 | Fujimori et al. |
| 6,589,333 B1 | 7/2003 | Gosele et al. |
| 7,128,974 B2 | 10/2006 | Scarsbrook et al. |
| 7,172,957 B2 | 2/2007 | Namba et al. |
| 2001/0044029 A1 | 11/2001 | Fujii et al. |

FOREIGN PATENT DOCUMENTS

| JP | 3-75298 A | 3/1991 |
| JP | 7-17793 A | 1/1995 |
| JP | 07-017794 | 1/1995 |
| JP | 2003-277183 | * 10/2003 |
| JP | 2003-277183 A | 10/2003 |
| WO | WO 01/96633 | 12/2001 |
| WO | WO 01/96634 | 12/2001 |

OTHER PUBLICATIONS

Walker, John, "Optical absorption and luminescence in diamond." Prog. Phys., vol. 42, pp. 1605-1659 (1979).
Posthill et al., "Demonstration of a Method to Fabricate a Large-Area Diamond Single Crystal" Thin Solid Films, Elsevier-Sequoia S.A. Lausanne, CH, vol. 271, No. 1/2, Dec. 15, 1995, pp. 39-49, XP 000621393.
A.M. Zaitsev, "Optical Properties of Diamond", EP 05 250 164, Nov. 30, 2006.
Properties, Growth and Applications of Diamond, Edited by M.H. Nazare and A.J. Neves.
Smooth and high-rate reactive ion etching of diamond, Yutaka Ando, EP 05 250 164, Nov. 30, 2006.
Raman Spectrum of Diamond, S.A. Solin, Printed Dec. 21, 2006.
"Reactive ion etching of CVD-diamond for piezoresistive pressure sensors", R. Otterbach, EP 05 250 164, Nov. 30, 2006.
R.M. Chrenko, "C-doped diamond: Raman spectra", Communications, EP 05 250 164, Nov. 30, 2006.
"Mechanism of diamond growth by chemical vapor deposition on diamond", (100), (111), and (110) surfaces: Carbon-13 studies, C.J. Chu.
Office Action dated Dec. 28, 2006.
Office Action dated Dec. 20, 2006.

* cited by examiner

*Primary Examiner*—Edward M Johnson
(74) *Attorney, Agent, or Firm*—McDermott Will & Emery LLP

(57) ABSTRACT

A diamond single crystal substrate manufacturing method for growing by vapor-phase synthesis a single crystal from a diamond single crystal seed substrate, comprising etching away by reactive ion etching, prior to single crystal growth, at least 0.5 μm and less than 400 μm, in etching thickness off the surface of the seed substrate which has been mechanically polished, thereby removing from the surface of the seed substrate the work-affected layers caused by mechanical polishing; and growing then a single crystal thereon. The manufacturing method provides a diamond single crystal substrate having a high quality, large size, and no unintentional impurity inclusions, and suitable for use as semiconductor materials, electronic components, optical components or the like.

4 Claims, 4 Drawing Sheets

DIAMOND SINGLE CRYSTAL SUBSTRATE MANUFACTURING METHOD

RELATED APPLICATIONS

This application is a Divisional of U.S. application Ser. No. 11/032,176, filed Jan. 11, 2005, now U.S. Pat. No. 7,481,879 claiming priority of Japanese Application Nos. 2004-009047, filed Jan. 16, 2004; 2004-081815, filed Mar. 22, 2004; and 2004-322048, filed Nov. 5, 2004, the entire contents of each of which are hereby incorporated by reference.

BACKGROUND OF THE INVENTION

1. Field of the Invention

The present invention relates to a diamond single crystal substrate manufacturing method and a diamond single crystal substrate, especially a diamond single crystal substrate manufacturing method and a diamond single crystal substrate, having a high quality, large size and no unintentional impurity inclusions, and suitable for use as semiconductor materials, electronic components, optical components, or the like.

2. Description of the Prior Art

The many outstanding properties of diamond, such as high thermal conductivity, high electron/hole mobility, high dielectric breakdown field, low dielectric loss and wide bandgap, make it an unparalleled semiconductor material. In recent years, in particular, ultraviolet light emitting devices that take advantage of diamond's wide bandgap, and field effect transistors having excellent high frequency characteristics, etc. have been developed. Thanks to its transparency extending from the ultraviolet to the infrared region, diamond shows promise as well as a material for optical components.

In order to use diamond as a semiconductor, it is necessary to make it into high-quality, large-size single crystal substrates, as with other semiconductor materials. Diamond single crystals are obtained at present chiefly by high-temperature high-pressure synthesis methods, which result in superior crystallinity compared with natural single crystals, but that suffer from the inclusion of nitrogen impurities in the crystals unless special growth conditions are used. A substrate containing nitrogen is difficult to use on its own as a semiconductor single crystal, for which reason seed substrates are often used for growing diamond single crystals using a vapor-phase synthesis method that reduces impurity inclusions (see for instance, Japanese Patent Publication No. 2003-277183A).

Also, the size of the diamond single crystals obtained by the high-temperature high-pressure synthesis methods is limited to a grade of 1 cm, and it is difficult to achieve large-size single crystals with diameters of not smaller than 10 mm. Research is being conducted therefore in order to manufacture a larger surface area single crystals by vapor-phase synthesis, wherein the single crystals above are used as seed substrates. For instance, Japanese Patent Publication No. 03-75298A discloses a method for manufacturing diamond single crystals by arranging the orientations of a plurality of single crystal diamonds in approximately the same direction and then growing a diamond thereon by vapor-phase synthesis thereon. For obtaining large-size diamond single crystals using such a method, Japanese Patent Publication No. 07-17794A discloses that, by controlling the crystal orientation, spacing and height of a plurality of single crystal diamonds and restricting the growth temperature to an adequate range in order for homoepitaxial growth to be maintained up to a predetermined thickness, a high-purity vapor phase synthesis is achieved that allows providing large-size diamond single crystals for optical or semiconductor use, with 15 mm or larger diameters and having a good crystallinity, supported by ultraviolet transparency near the 250 nm wavelength region, X-ray rocking curves with a half-width value of 100 seconds or less, Raman scattering spectra with a half width of $2\ cm^{-1}$, etc.

As described in Japanese Patent Publication No. 2003-277183A, when diamond single crystals are grown by vapor-phase synthesis on a diamond single crystal substrate obtained by a high-pressure synthesis process, residual stresses accumulate in the vapor-phase growth layer. Residual stresses remaining in the vapor-phase growth layer are problematic in that the associated crystal strain may alter semiconductor properties such as bandgap, mobility, etc. These phenomena are not solved by the vapor-phase growth of diamond single crystals from seed substrates 100 μm or less thick, as disclosed in Japanese Patent Publication No. 2003-277183A. Also, diamond single crystal substrates obtained by formation of thick films having a thickness of 100 μm or more by vapor-phase synthesis may threaten with substrate cracking due to accumulated stresses. Owing to the increased probability of substrate cracking entailed by substrates having a larger size (larger surface area, thicker film), the above problems in obtaining large-size diamond single crystal substrates, as described in particular in Japanese Patent Publication Nos. 03-75298A and 7-17794A, are not essentially solved using a method as described in Japanese Patent Publication No. 03-75298A, wherein large-size single crystal substrates are obtained by integrating in a single unit substrates consisting of an arrangement of a plurality of high-pressure phase substances having essentially mutually identical crystal orientations and acting as vapor-phase growth nuclei upon which is then grown a single crystal by vapor phase synthesis, or using a method as described in Japanese Patent Publication No. 7-17794A, wherein large-size single crystal substrates are obtained by controlling the single crystal growth conditions.

Also, the practical implementation of large-size diamond homoepitaxial growth by conventional techniques such as those described in Japanese Patent Publication Nos. 03-75298A and 7-17794A is plagued by problems of unintentional impurities becoming enclosed in the crystal. When unintentional impurities become trapped in the crystal, an impurity level is reached which is incompatible with the targeted use as semiconductor, etc. and that impairs not only its use as a semiconductor substrate, but restricts as well, due to changes elicited in the optical properties of the crystal, its use as an optical substrate. Elements enclosed as impurities in diamond single crystals grown homoepitaxially by chemical vapor-phase synthesis include mainly hydrogen, silicon, nitrogen, boron, etc.; among these, nitrogen impurities introduced unintentionally in the crystal are the most influential as regards semiconductor and optical properties. Nitrogen is the element most difficult to control as an impurity, since it is an essential component of the atmosphere and is therefore present in non-negligible amounts inside vacuum vessels. Thus in order to manufacture diamond single crystal substrates for semiconductor or optical use by vapor-phase synthesis it is vital to assess and control nitrogen impurities; however, at present it is extremely difficult to predict semiconductor and optical properties by regulating the amount of impurity inclusions through a strict control of the factors that affect their uptake. Thus far, methods for obtaining diamond single crystals by heteroepitaxial methods result in large numbers of crystal defects and therefore in an insufficient quality for warranting use as optical or semiconductor substrates.

SUMMARY OF THE INVENTION

An object of the present invention is to overcome the above shortcomings and to provide a diamond single crystal substrate manufacturing method and a diamond single crystal substrate having a high quality, large size, and no unintentional impurity inclusions, and suitable for use as semiconductor materials, electronic components, optical components, or the like.

In order to solve the above problems, the present invention is as follows:

(1) A diamond single crystal substrate manufacturing method by growing a single crystal from a diamond single crystal seed substrate by vapor-phase synthesis, the method comprising etching away by reactive ion etching, prior to single crystal growth, at least 0.5 μm and less than 400 μm, in etching thickness, off a surface of the seed substrate which has been mechanically polished, and growing then a single crystal thereon.

(2) The method according to the above (1), comprising etching away, prior to single crystal growth, at least 50 nm, in etching thickness, off side faces of the seed substrate, and growing then a single crystal thereon.

(3) The method according to any one of the above (1) or (2), wherein the etching gas in the reactive ion etching is a mixture gas of oxygen and carbon fluoride.

(4) The method according to any one of the above (1) to (3), wherein an etching pressure in the reactive ion etching is at least 1.33 Pa and no more than 13.3 Pa.

(5) The method according to any one of the above (1) to (4), wherein the substrate temperature during etching in the reactive ion etching is 800K or less.

(6) A diamond single crystal substrate grown from a diamond single crystal seed substrate by vapor-phase synthesis, wherein the diamond single crystal substrate is obtained by etching away by reactive ion etching, prior to single crystal growth, at least 0.5 μm and less than 400 μm, in etching thickness, off a mechanically polished surface of the seed substrate, and by growing then a single crystal thereon.

(7) The diamond single crystal substrate according to the above (6), wherein the diamond single crystal substrate is obtained by etching away, prior to single crystal growth, at least 50 nm, in etching thickens, off side faces of the seed substrate, and growing then a single crystal thereon.

(8) The diamond single crystal substrate according to the above item (6) or (7), wherein the diamond intrinsic Raman shift by Raman spectroscopy of a substrate surface after single crystal growth falls within a deviation of 0.5 cm$^{-1}$ from 1332 cm$^{-1}$, which is the standard Raman shift of a strain-free diamond.

(9) The diamond single crystal substrate according to any one of the above (6) to (8), wherein a hole mobility of a hydrogenated surface conductive layer of the diamond single crystal substrate at normal temperature as obtained by Hall measurement is 900 cm$^2$/V·sec or more.

(10) The diamond single crystal substrate according to any one of the above (6) to (9), wherein in a cathodoluminescence spectrum measured across all the faces of the diamond single crystal substrate at a measurement temperature of 40 K or less, the emission peak intensity at 575 nm is at least 2 times and no more than 10 times as high as the highest peak intensity among peak intensities at any arbitrary wavelength within a range of from 200 nm to 900 nm (excluding the emission peak intensity at 575 nm) and a background intensity, and the peak full-width at half-maximum at 575 nm is 2.5 nm or less.

(11) The diamond single crystal substrate according to anyone of the above (6) to (9), wherein in a photoluminescence spectrum measured across all the faces of the diamond single crystal substrate at a measurement temperature of 40K or less using an excitation light source having a wavelength of 514.5 nm, the emission peak intensity at 575 nm is at least 2 times and no more than 10 times as high as the highest peak intensity among peak intensities at any arbitrary wavelength within a range of from 500 nm to 900 nm (excluding the emission peak intensity at 575 nm and a peak intensity at the excitation wavelength and Raman peak intensities caused by diamond lattice vibration) and a background intensity, and the peak full-width at half-maximum at 575 nm is 2.5 nm or less.

(12) The diamond single crystal substrate according to any one of the above (6) to (11), wherein the nitrogen concentration in the single crystal is 10 ppm or less.

(13) The diamond single crystal substrate according to any one of the above (6) to (12), wherein the diameter of the diamond single crystal substrate is 10 mm or more.

(14) A diamond single crystal seed substrate for growing thereon a diamond single crystal by vapor-phase synthesis, wherein at least 0.5 μm and less than 400 μm, in etching thickness, are etched away by reactive ion etching off a mechanically polished surface of the seed substrate.

(15) The diamond single crystal seed substrate according to the above (14), wherein at least 50 nm, in etching thickness, is etched away by reactive ion etching off side surfaces of the seed substrate.

The term "surface" of the substrate in the above is also mentioned as "main face". Throughout the present specification, the etching amount is indicated by etching thickness unless otherwise specified.

The method for manufacturing a diamond single crystal substrate according to the present invention allows manufacturing high-quality and strain-free large-size diamond single crystal substrates for semiconductor materials, electronic components, optical components, etc.

DETAILED DESCRIPTION OF THE PREFERRED EMBODIMENTS

Figure 1:
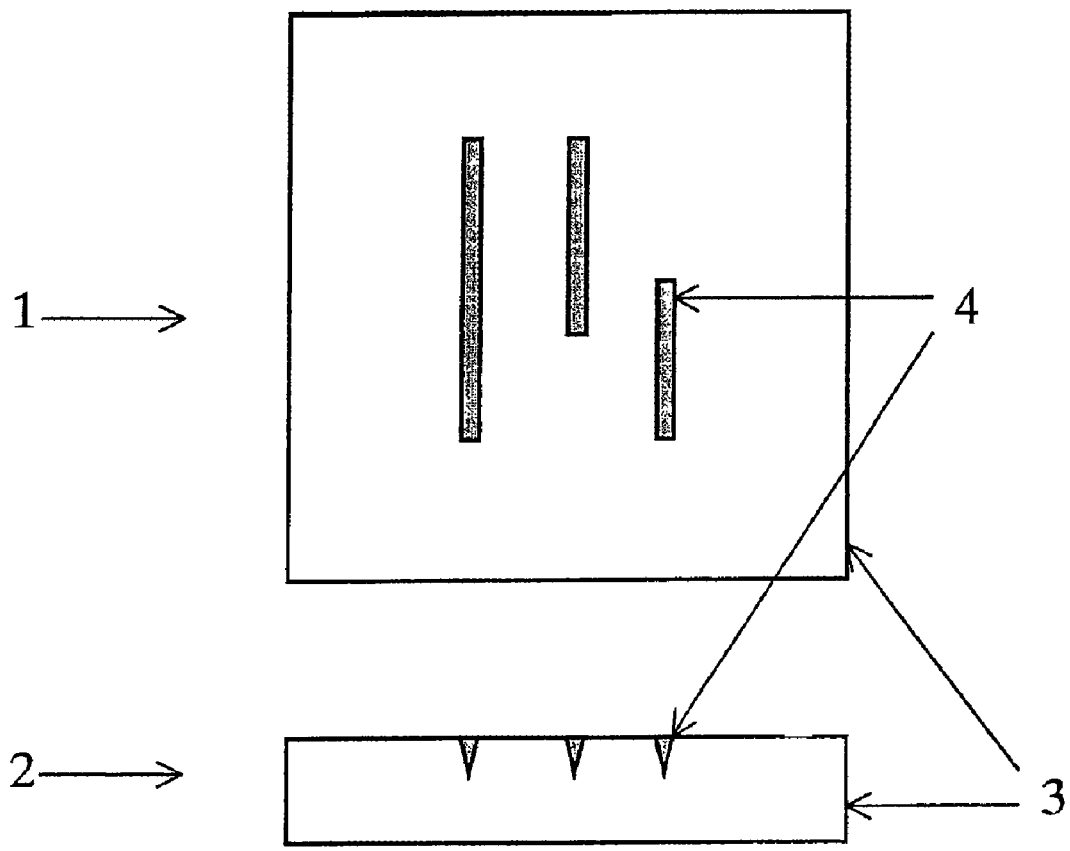
FIG. 1 is a schematic diagram of a diamond single crystal seed substrate before etching used in the present invention.

The invention is explained next.

The present inventors analyzed in detail the phenomenon of stress accumulation, occurring during vapor-phase growth of diamond single crystals on diamond single crystals used as seed substrates, using a microscopic Raman spectrometer allowing the measurement of two-dimensional surface distributions. As a result, the inventors discovered that the portions of single crystal grown from areas of the seed substrate with originally numerous mechanical polishing flaws deviated from 1332 cm$^{-1}$, which is the standard Raman shift of diamond, within several cm$^{-1}$. Raman shift is caused by the natural vibration frequency of the crystal lattice; herein deviations from the intrinsic shift of diamond are used to identify strain in regions where crystal lattice distances are narrower or wider than normal. It was thus found that the portions of single crystal grown from areas of the seed substrate having originally numerous mechanical polishing flaws were areas with a higher than normal strain.

Next, the aforementioned areas of the seed substrate surface having numerous mechanical polishing flaws were cut by a focused ion beam and were inspected under transmission electron microscopy. The results showed a disarray of the diamond's crystallinity in the vicinity of the polished surfaces of the areas with the larger number of mechanical polishing flaws, with partial non-crystalline layers. Furthermore, electron beam diffraction images obtained simultaneously showed, in the aforementioned areas, ring-shaped spreading images in addition to the intrinsic point images of diamond single crystal lattice, indicating the presence of non-crystalline diamond and polycrystalline diamond which are different from single crystal diamond, as well as unevenly distributed dislocations/defects, etc. (hereinafter work-affected layers). The marked presence of work-affected layers in the areas with more mechanical polishing flaws suggests that such work-affected layers are induced during mechanical polishing.

The side faces of the seed substrate above were inspected in the same way and showed also identical work-affected layers. These work-affected layers in the side faces of the seed substrate were observed not only in polished seed substrates but in seed substrates shaped by laser cutting as well, an indication that work-affected layers are also affected by laser processing.

Methods for identifying the impurities/defect levels in crystals include cathodoluminescence (hereinafter CL) spectrometry and photoluminescence (hereinafter PL) spectrometry. As a result of a diligent research of the relationship between CL and PL distributions, composition of the infused gas, and crystallinity of vapor-phase synthesized single diamond crystals, the inventors found that the single crystal diamond preferably meets the following conditions. Specifically, the measured CL spectrum of a diamond single crystal cooled to a low temperature of 40K or less should have an emission peak intensity at 575 nm is at least 2 times and no more than 10 times as high as the highest peak intensity among peak intensities at any arbitrary wavelength within a range of from 200 nm to 900 nm (excluding the above emission peak intensity at 575 nm) and the background intensity, and a peak full-width at half-maximum at 575 nm of 2.5 nm or less. The emission peak at 575 nm of the PL spectrum measured with an excitation light source having a wavelength of 514.5 nm is constrained in the same way as for the CL spectrum. Peak intensities are defined herein as the effective peak intensity resulting from subtracting the background value from the maximum value of the corresponding peak, and are usually obtained through a Gaussian-Lorentian fitting.

Light emission at 575 nm in the PL and CL of diamond is called the N-V center, and is believed to be caused by links between nitrogen impurities and lattice vacancies (cf. Rep. Prog. Phys., Vol. 42, (1979) P. 1605). If during the growth of the single crystal the vapor-phase contains nitrogen, the latter will be mixed into the single crystal and will cause emission at 575 nm. Regarding specimens in which peak separation was difficult, since peaks widened in the measurements of CL/PL at normal temperatures, the present inventors carried out the measurements of those specimens at a low temperature of 30K and succeeded thereby in observing different peaks for different levels. This revealed that peak intensity at 575 nm is intimately related to the degree of crystal impurities/defects, which are in turn correlated with semiconducting and optical properties, and can be used therefore as a benchmark for regulating crystallinity. As a result, the unnecessarily strict nitrogen impurity controls of conventional technology can now give way to diamonds of adequate crystallinity being obtainable with such controls kept to a minimum. The nitrogen impurity concentration in diamond single crystals thus obtained is preferably 10 ppm or less relative to carbon atoms. The present inventors noticed that a number of nitrogen atoms below that value yielded semiconductor/optical substrates with no problems in practice. Diamond single crystal having a diameter of 10 mm or more and satisfying the aforementioned CL and PL criteria hold much promise of becoming large-size single crystal substrates especially suitable for optical use. In the present invention, diameter refers to the length of the longest straight line that can be drawn in a single crystal of a given size and shape.

The present invention, based on the above findings, comprises etching away by reactive ion etching (hereinafter RIE), prior to single crystal growth, at least 0.5 μm and less than 400 μm off the surface of the seed substrate obtained by mechanical polishing, and then growing a single crystal thereon. Since the surface of the single crystal seed substrate used for vapor-phase growth is polished mechanically, the polished surface contains work-affected layers with metallic impurities and/or processing defects, etc., that are disadvantageous for single crystal vapor-phase growth. High quality diamond single crystals object of the present invention can be obtained by conducting reactive ion etching prior to the step of single crystal growth, because this pre-growth reactive ion etching removes these work-affected layers. Preparing seed crystals free of the aforementioned work-affected layers should suffice to curb the occurrence of strain in the diamond single crystals during vapor-phase growth; however, in view of their origin, removing such work-affected layers by mechanical polishing is fraught with difficulties.

Non-mechanical diamond processing includes various conventional processes, for instance RIE etching, microwave plasma etching, ECR plasma etching, ion beam etching, etc. Among these non-mechanical processes alternatives, only RIE methods can tackle successfully all the aspects of processing speed, processing area, surface roughness after processing, formation of damaged layers upon etching, etc. RIE is a high-speed smooth method that allows removing only work-affected layers from the seed substrate without damaging the latter. Following RIE, vapor-phase growth of single crystals allows obtaining high-quality and strain-free large-size diamond single crystal substrates.

The RIE according to the present invention may be carried out using known methods. In the present invention may be used for instance methods using capacitively coupled plasma (CCP) wherein a high-frequency power source is connected to electrodes arranged facing one another inside a vacuum vessel, or methods using inductively coupled plasma (ICP) wherein a high-frequency power source is connected to a coil wound around a vacuum vessel, or combinations of these methods.

Mixtures of oxygen and carbon fluoride are preferably used for the etching gas, with preferred etching pressures of 1.33 Pa or more and 13.3 Pa or less. The above gas types and pressures allow removing only the work-affected layers, smoothly and at high speeds.

A suitable etching thickness of the seed substrate in the present invention is at least 0.5 μm and less than 400 μm, preferably at least 5 μm and no more than 50 μm, and more preferably at least 10 μm and no more than 30 μm. The shorter processing time of a thinner etching thickness is advantageous for preserving surface smoothness. The thickness of the work-affected layer of the seed substrate depends on the type and strength of the polishing used. Most polishing is done with depths of less than 0.5 μm, but occasionally depths of about 10 μm can be reached locally, causing portions grown from such areas to exhibit inferior semiconductor properties. Conversely, a thicker etching depth requires a longer etching time and may result in increased etching-induced surface roughness, which may give rise to a degradation in crystallinity during the subsequent single crystal growth. A suitable temperature of the substrate during etching is 800K or less, preferably 600K or less. Carrying out the etching processing under the above conditions improves the crystallinity of the diamond single crystal substrate obtained thereafter by vapor-phase growth.

The side faces of the seed substrate according to the present invention are etched away likewise by RIE, in order to remove from them preferably at least 50 nm, more preferably at least 0.15 μm; in particular, when the side faces have also been mechanically polished, preferably 0.5 μm or more are removed from the side faces by etching. This allows reducing strain in areas grown laterally from the side faces, especially in cases of expanded growth in the horizontal direction during thick-film growth of single crystals. There are RIE methods for side faces wherein etching in the horizontal directing is performed simultaneously with the RIE of the seed substrate surface; however methods wherein only the side faces of a substrate standing up are etched are more effective as they allow controlling etching thickness individually.

Herein although any known method for diamond vapor-phase synthesis, such as a microwave plasma CVD method, or a direct current plasma CVD method. may be used for single crystal vapor-phase growth, preferably a microwave plasma CVD method is used from the viewpoint of growth rate, growth area and impurity inclusions.

In the diamond single crystal substrate according to the present invention obtained by the methods above, the fewer the work-affected layers on the seed crystal surface the better. In order to obtain a high-quality single crystal substrate by vapor phase synthesis using a diamond single seed crystal substrate according to the present invention, or to obtain a single crystal substrate at least 100 μm thick, the area density of work-affected layers in the etched seed substrate should be at most 1 occurrence per $cm^2$ (0.01 occurrence/$mm^2$), and the ratio of the surface occupied by the work-affected layers relative to the substrate should be 0.001% or less. The density and surface area of these work-affected layers can be evaluated by transmission electron microscopy inspection, as mentioned above, or by means of microscopic Raman spectroscopy, described below, growing ultra-thin (e.g. thickness of 1 μm or less) diamond single crystals, or by any other means apart from these two.

After the growth of the diamond single crystal by vapor-phase synthesis according to the present invention, the surface of the resultant single crystal substrate can be evaluated for strain using a microscopic Raman spectrometer. High-quality single crystals substrates can be achieved by keeping the Raman shift caused by strain in the surface of the diamond single crystal substrate according to the present invention within a deviation of 0.5 $cm^{-1}$ from a Raman shift of 1332 $cm^{-1}$ corresponding to a strain-free diamond single crystal (standard shift).

The CL measurement conditions in the present invention do not require a pre-measurement application of a conductive layer coating on the faces to be measured. Herein the voltages and currents of the electron beam are not limited to customary values that range respectively from 10 to 30 kV and from 0.1 to 100 nA.

In the present invention, the wavelength of the excitation light source used in the PL measurement must be that of a 514.5 nm monochromatic light, for which an argon gas laser is ordinarily used. The output of the excitation light source may have an arbitrary intensity, but when collected by a microscope, etc., an excessive energy density might damage the specimens, for which reason measurements must be carried out within threshold levels. Unlike CL spectra, PL spectroscopy measures the light source wavelengths (Rayleigh scattered light) and the Raman scattered light caused by vibrations of the diamond lattice, though not for comparison with PL peak at 575 nm.

The common CL/PL measurement conditions in the present invention may involve measurements with crystals at a temperature of 40K or less, but also any other temperature provided the CL/PL peak intensity conditions according to the present invention are satisfied. In the present invention 30K was set as a standard temperature. Herein a 575 nm peak full-width at half-maximum of 2.5 nm or less is desired, therefore a spectrum-measuring device having a wavelength resolution of 1.0 nm or less is preferable.

Examples of the present invention are described in detail below, with reference made to relevant accompanying drawings.

The diamond seed substrates used in Examples 1 and 2 of the present invention and Comparative Examples 1 to 3 will be explained first. The diamond seed substrate used in these examples were prepared in the same manner.

A diamond single crystal obtained by the high-temperature high-pressure method was used as a diamond seed substrate 3. The substrate was a plate 4 mm long and wide and 0.5 mm thick with orientation {100} in the main face 1 and the side faces 2. The main face 1 had been mechanically polished and in the side faces 2 the carbon layers had been removed by bichromic acid treatment after laser cutting/shaping. The surface roughness (Rmax) was 0.1 μm. The Raman shift distribution of the main face was measured using a microscopic Raman spectrometer allowing the measurement of two-dimensional surface distributions; the measurement results centered around a Raman shift of 1332 $cm^{-1}$ corresponding to a strain-free diamond single crystal (hereinafter "standard shift") with a 0.1 $cm^{-1}$ shift deviation from that value (hereinafter "strain shift", deviation from the standard shift). Furthermore, a seed substrate prepared separately, inspected under transmission electron microscopy, showed the presence of work-affected layers 4 on the main face of the seed substrate, as shown in FIG. 1.

EXAMPLE 1

The main face and side faces of the above seed substrate were etched by RIE using CCP of conventional high-frequency interelectrode discharge type. The etching conditions are listed in Table 1.

TABLE 1

| High-frequency wave frequency | 13.56 MHz |
|---|---|
| High-frequency wave power | 300 W |
| Chamber inner pressure | 6.67 Pa |
| $O_2$ gas flow rate | 10 sccm |
| $CF_4$ gas flow rate | 10 sccm |

Figure 2:
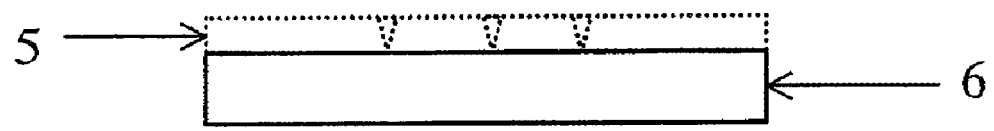
FIG. 2 is a side view of a seed substrate after etching used in the present invention.

By etching the main face during 5 hours and, with the substrate standing up, all the side faces during 30 minutes each, under the conditions shown in Table 1, 15 μm of the main face 1 and 1.5 μm of each of the side faces 2 of the seed substrate 3 were removed (FIG. 2). In FIG. 2, 5 is the etched away layer. The roughness after etching, 0.1 μm, showed no change relative to the roughness prior to etching. Also, a seed substrate prepared separately was etched under etching conditions identical to those listed in Table 1, then its surface after etching was assessed by transmission electron microscopy, showing no work-affected layers.

Next, a diamond single crystal was grown by vapor phase on the seed substrate 6 after etching using a conventional microwave plasma CVD method. The growth conditions are given in Table 2.

TABLE 2

| Microwave frequency | 2.45 GHz |
|---|---|
| Microwave power | 5 kW |
| Chamber inner pressure | $1.33 \times 10^4$ Pa |
| $H_2$ gas flow rate | 100 sccm |
| $CH_4$ gas flow rate | 5 sccm |
| Substrate temperature | 900° C. |
| Growth time | 20 hours |

Figure 3:
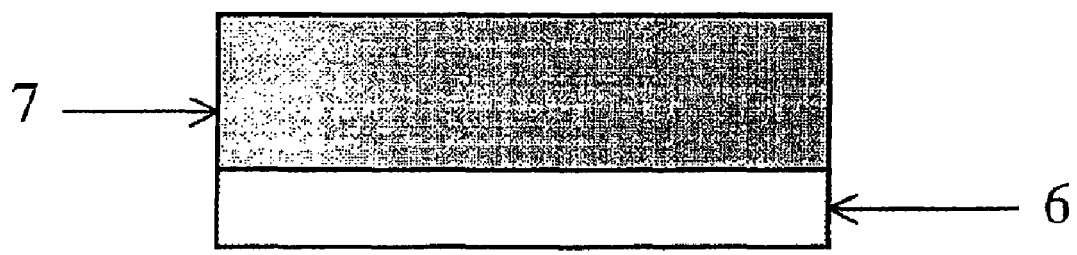
FIG. 3 is a side view of an obtained diamond single crystal substrate according to the present invention.

The diamond single crystal was grown by the vapor phase synthesis method by 200 μm on the seed substrate 6 under the growth conditions listed in Table 2 (FIG. 3). The Raman shifts of the diamond single crystal layer 7 after growth was measured by a microscopic Raman spectrometer and showed strain shifts within 0.1 cm$^{-1}$ for the entire grown surface. In order to assess semiconductor properties, the substrate was subjected to hydrogen plasma treatment and the thus hydrogenated surface conductive layer was evaluated for the hole mobility at normal temperature by Hall measurement; herein high mobility values of 1000 cm$^2$/V·sec were obtained. The results of this evaluation are given in Table 3.

Table 3 summarizes the values for etching thickness, surface roughness after etching, density of work-affected layers, maximum Raman strain shift after single crystal growth, and hole mobility by Hall measurement.

COMPARATIVE EXAMPLE 1

Figure 4:
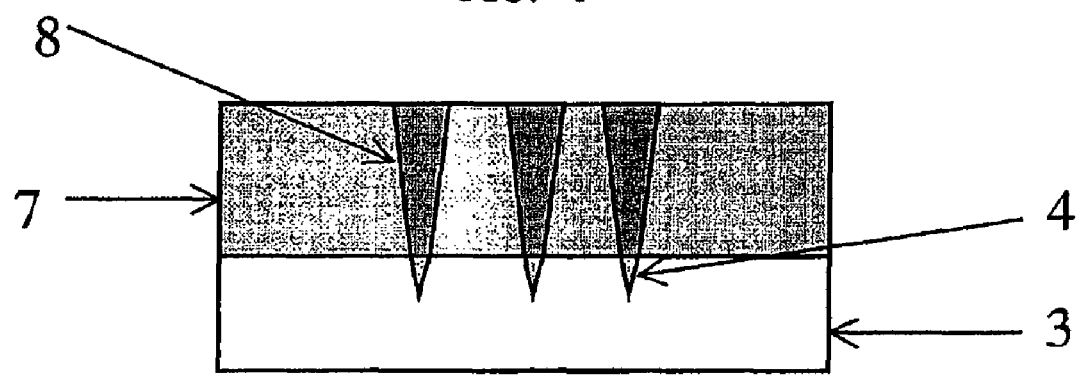
FIG. 4 is a side view of the diamond single crystal substrate manufactured in Comparative Example 1.

In the present comparative example testing was performed under the same conditions of Example 1 except that herein no etching of the seed substrate 3 was carried out. In this case, where the diamond single crystal was grown under the conditions of Table 2 without etching, crystal strain was measured in the single crystal areas grown from work-affected layers (FIG. 4). In FIG. 4, reference numeral 8 represents the strain regions grown from the work-affected layers. The values obtained for maximum strain shift (2.5 cm$^{-1}$) by Raman spectroscopy and hole mobility (100 cm$^2$/V·sec) were both inadequate for use as a semiconductor substrate.

The evaluation results for Comparative Examples 1 and 2 are given in Table 3.

EXAMPLE 2

The present example, wherein the etching thickness of the seed substrate main face 1 was 0.6 μm and the etching thickness of the side faces 2 was 0.06 μm, involved a relatively thinner etching thickness.

Several seed substrates were used, among which in one case was measured one work-affected layer after etching over a square substrate 4 mm wide, and in one case no such layer was measured (i.e. 0 to 1 occurrences/16 mm$^2$). Diamond single crystals were grown on these substrates under the conditions listed in Table 2, apparently with no crystal strain, although the measurement of the crystal surfaces by Raman spectroscopy, yielding a maximum strain shift of 0.3 cm$^{-1}$, did show a slight strain. The hole mobility of 910 cm$^2$/V·sec was that of a relatively high-mobility performance.

COMPARATIVE EXAMPLE 3

In the present comparative example testing was performed under the same conditions of Example 1 except that herein the etching thickness of the main face 1 was 450 μm and the etching thickness of the side faces 2 was 45 μm.

The surface after etching was somewhat rough, with a Rmax value of 10.1 μm. Though no work-affected layers were observed, some growth unevenness caused by initial surface roughness was detected in the subsequently grown diamond single crystals. As a result, the values obtained for maximum strain shift (0.6 cm$^{-1}$) by Raman spectroscopy and hole mobility (410 cm$^2$/V·sec) were inadequate for use as a high-performance semiconductor substrate.

TABLE 3

| | Etching thickness (μm) | | After etching | | After single crystal growth | |
| --- | --- | --- | --- | --- | --- | --- |
| | main face | side face | Surface roughness Rmax (μm) | Work-affected layer density (occurrences/ 16 mm$^2$) | Raman maximum strain shift (cm$^{-1}$) | Hole mobility (cm$^2$/ V · sec) |
| Example 1 | 15 | 1.5 | 0.1 | 0 | 0.1 | 1000 |
| Comp. Example 1 | 0 | 0 | 0.1 | 20 or more | 2.5 | 100 |
| Comp. Example 2 | 0.4 | 0.04 | 0.1 | 3 | 1.1 | 220 |
| Example 2 | 0.6 | 0.06 | 0.1 | 0-1 | 0.3 | 910 |
| Comp. Example 3 | 450 | 45 | 10.1 | 0 | 0.6 | 410 |

COMPARATIVE EXAMPLE 2

In the present comparative example testing was performed under the same conditions of Example 1 except that herein the etching thickness of the seed substrate main face 1 was 0.4 μm and the etching thickness of the side faces 2 was 0.04 μm. Most of the work-affected layers were removed after etching but parts of deep work-affected layers remained unchanged, without being etched. A diamond single crystal was grown on this substrate under the same conditions listed in Table 2, and as in Comparative Example 1, crystal strain was measured also in the single crystal areas grown from work-affected layers. The values obtained for maximum strain shift (1.1 cm$^{-1}$) by Raman spectroscopy and hole mobility (220 cm$^2$/ V·sec), though improving on those of Comparative Example 1, were inadequate for use as a semiconductor substrate.

EXAMPLES 3 TO 5

COMPARATIVE EXAMPLES 4 TO 5

Below are explained examples in which vapor-phase synthesized diamond single crystal substrates were obtained through homoepitaxial growth by vapor phase synthesis from diamond single crystal seed substrates obtained by the high-temperature high-pressure method.

The seed substrate was a plate 8 mm long and wide (diameter 11.2 mm) and 0.5 mm thick with main face 1 and side faces 2 mechanically polished. The orientation was {100} for both the main face 1 and the side faces 2. First, the surface layer of the main face 1 of the seed substrate 3 was etched away by reactive ion etching (RIE) of a conventional high-frequency interelectrode discharge type (CCP). The etching conditions are listed in Table 4.

TABLE 4

| | |
|---|---|
| High-frequency wave frequency | 13.56 MHz |
| High-frequency wave power | 300 W |
| Chamber inner pressure | 6.67 Pa |
| $O_2$ gas flow rate | 10 sccm |
| $CF_4$ gas flow rate | 10 sccm |
| Substrate temperature | 550 K. |

0.6 μm of the seed substrate main face were removed after etching for 1 hour under the conditions listed in Table 4.

Next, a diamond single crystal was homoepitaxially grown on the substrate 6 using a conventional microwave plasma CVD method. The growth conditions are given in Table 5.

TABLE 5

| | |
|---|---|
| Microwave frequency | 2.45 GHz |
| Microwave power | 5 kW |
| Chamber inner pressure | $1.33 \times 10^4$ Pa |
| $H_2$ gas flow rate | 100 sccm |
| $CH_4$ gas flow rate | 15 sccm |
| $H_2$ and $CH_4$ gas purity | not less than 99.9999% |
| Nitrogen concentration in the vapor phase | 3 ppm |
| Substrate temperature | 1300 K. |
| Growth time | 30 hours |

The film deposition yielded a diamond single crystal substrate with a vapor-phase synthesized single crystal layer 0.5 mm thick.

The vapor-phase synthesized single crystal layer of the diamond single crystal substrate was cut off by laser cutting, then the growth faces and the cut faces were polished and CL and PL measurements were carried out under the conditions listed in Table 6 and Table 7, respectively.

TABLE 6

| | |
|---|---|
| Measurement temperature | 30 K. |
| Electron acceleration voltage | 15 kV |
| Electron current | 17 nA |
| Wavelength resolution | 0.8 nm or less |

TABLE 7

| | |
|---|---|
| Measurement temperature | 30 K. |
| Wavelength of excitation light source | 514.5 nm |
| Output of the excitation light source | 10 mW |
| Wavelength resolution | 0.9 nm or less |

Figure 5:
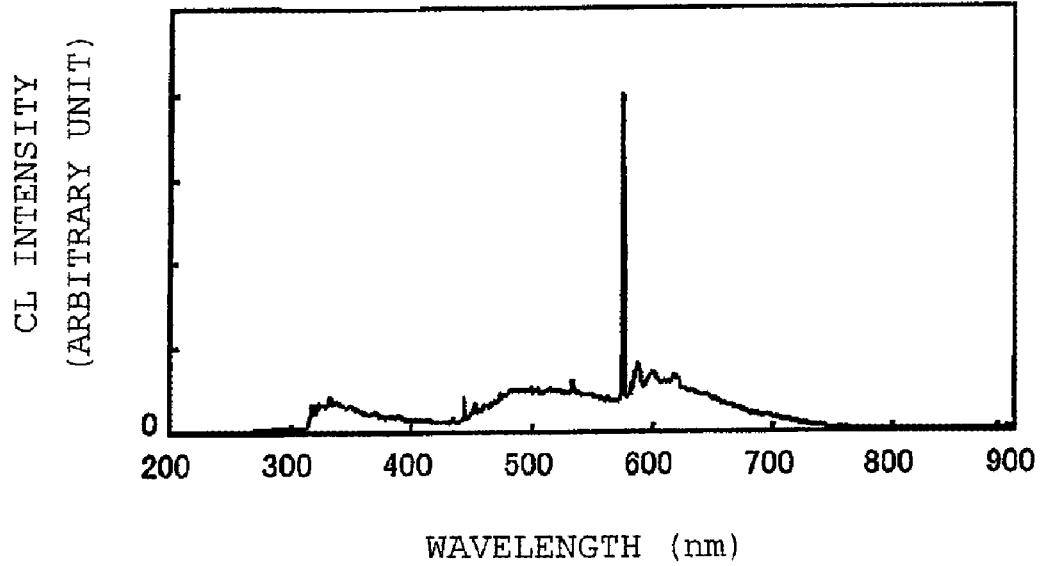
FIG. 5 is an example of the cathodoluminescence (CL) spectrum measurement in an example of the present invention.

FIG. 5 shows the CL spectrum measured under the conditions of Table 6. As can be seen in FIG. 5, a sharp peak at a wavelength of 575 nm was measured among other peaks. The value (PA/PB) resulting from dividing the emission peak intensity (PA) at 575 nm by the highest intensity (PB) among other peaks and the background (in this measurement at 588 nm) was 4.86, while the full-width at half-maximum (PW) of PA was 1.03. The PL spectrum was obtained under the conditions of Table 7 in the same way as the CL spectrum; herein PA/PB was 3.95, and PW=1.21.

Figure 6:
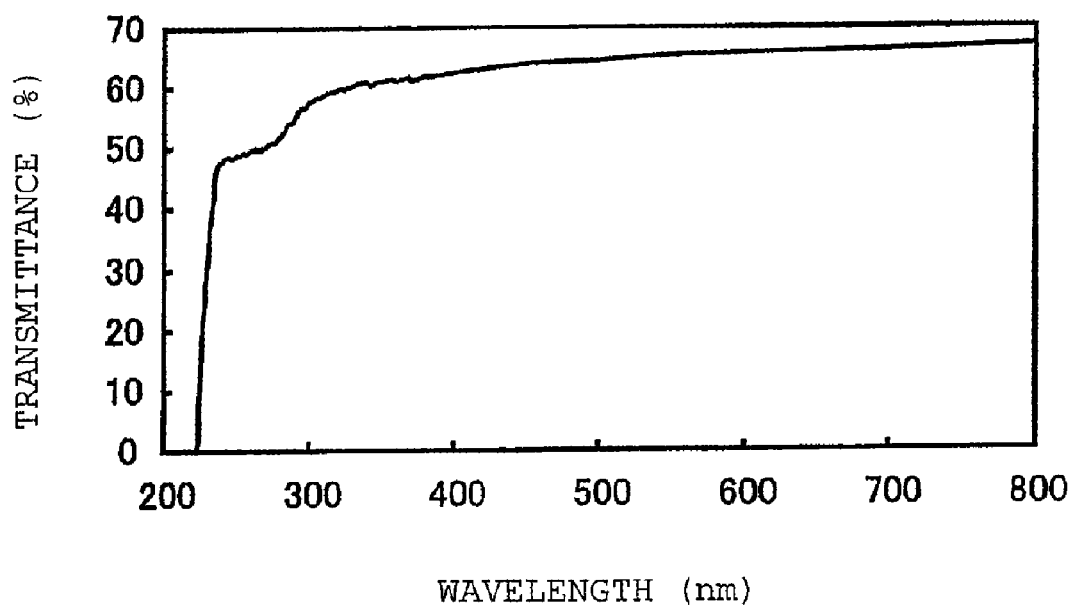
FIG. 6 is the transmission spectrum of an example of the present invention.

The crystallinity of the diamond single crystal substrate obtained in the present example was evaluated next. First, as an assessment of semiconductor properties, each substrate as a test specimen was subjected to hydrogen plasma treatment and the thus hydrogenated surface conductive layer was evaluated for the hole mobility at normal temperature by Hall measurement; the high mobility value of 1050 $cm^2$/V·sec obtained herein was adequate for semiconductor substrates. Next the amount of nitrogen impurities in the crystals was quantitatively determined by secondary ion mass spectrometry, yielding a sufficiently low value of 3.1 ppm relative to carbon atoms. Finally optical properties were evaluated on the basis of the transmission spectrum in a wavelength region extending from 200 nm to 800 nm (FIG. 6). As shown in FIG. 6, though some absorption caused by nitrogen impurities can be observed at a wavelength of 270 nm, there is transmission down to the 225 nm wavelength corresponding to the intrinsic absorption end of diamond; the crystal has therefore adequate optical properties. These results indicate that the diamond single crystal substrate of the present example is both a large-size and a high quality substrate.

Examples and comparative examples with modified single crystal growth conditions and changes in CL and PL are described next. High-purity single crystals were grown changing the $H_2$ and $CH_4$ gas purities shown in Table 4 in the preceding examples, and also the vacuum sealing method was modified in the growth process of Comparative Example 4. Except for the concentration of nitrogen in the vapor phase, the growth conditions and evaluation criteria were herein identical to those of the preceding examples. The growth conditions and the crystallinity evaluation results are given in Table 8.

TABLE 8

| | Nitrogen concentration in the vapor phase (ppm) | CL | | PL | | Hole mobility ($cm^2$/V·sec) | Nitrogen impurities (ppm) | UV optical properties |
|---|---|---|---|---|---|---|---|---|
| | | $P_A/P_B$ | $P_W$ (nm) | $P_A/P_B$ | $P_W$ (nm) | | | |
| Example 3 | 3 | 4.86 | 1.03 | 3.95 | 1.21 | 1050 | 3.1 | Good (FIG. 6) |
| Example 4 | 1 | 2.05 | 0.95 | 2.01 | 1.16 | 1100 | 0.9 | Good |
| Example 5 | 10 | 9.98 | 2.26 | 9.64 | 2.48 | 900 | 9.4 | Good |
| Comp. Example 4 | 0.1 or less | 1.88 | 0.94 | 1.81 | 1.12 | 1300 | 0.1 | Good |
| Comp. Example 5 | 100 | 10.9 | 2.51 | 10.3 | 2.67 | 300 | 32 | Poor (FIG. 7) |

In the Examples 3, 4 and 5 in Table 8, growth was carried out changing only the purity of the infused gases thus modifying the concentration of nitrogen in the vapor phase. For both CL and PL, PA/PB ranged from 2 to 10 and PW was 2.5 nm or less. The hole mobility of 900 cm$^2$/V·sec or more was a sufficient high mobility value for a semiconductor substrate. The nitrogen impurities were small, with transmittance up to the ultraviolet region, thus affording satisfactory optical properties.

Next, in Comparative Example 4, a single crystal was grown lowering to the limit the concentration of nitrogen in the vapor phase. A metal seal gasket was used in the vacuum seal member of the vacuum vessel and an ultrapure gas (purity 99.99999% or more) was used to achieve a nitrogen concentration of 0.1 ppm or less in the vapor phase. The single crystal obtained as a result showed a PA/PB for CL and PL of 1.9 or less and also good semiconductor and optical properties, though not markedly different from the characteristics observed in the invention Examples. This meant that the gas purity control applied in the present Comparative Example was unnecessarily strict.

Figure 7:
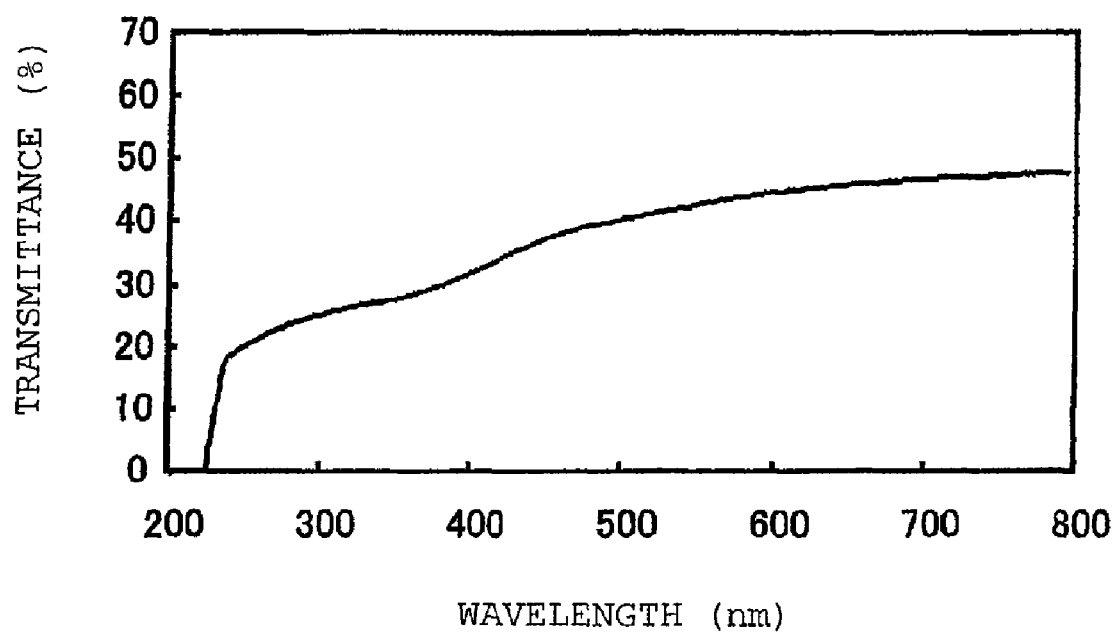
FIG. 7 is the transmission spectrum of Comparative Example 5.

In Comparative Example 5 the nitrogen concentration in the vapor phase was increased. The single crystal obtained showed a PA/PB for CL and PL of more than 10, and a PW spreading to 2.5 nm or more. As shown in FIG. 7, hole mobility dropped to ⅓ or less of the values in the Examples and nitrogen impurities increased, resulting in a deterioration of optical properties.

As demonstrated above, it was confirmed that the diamond single crystal seed substrates and the diamond single crystal substrates manufactured by the method of the present invention as represented by the above examples were desirably used as single crystal seed substrates and single crystal seed substrates for high-quality semiconductor materials.

The diamond single crystal substrates manufactured by the manufacturing method for diamond single crystal substrates according to the present invention are strain-free and have a high quality, with no unintentional impurity inclusions, which makes them suitable for use as large-size diamond single crystal substrates for semiconductor materials, electronic components, optical components, etc.

What is claimed is:

1. A diamond single crystal substrate manufacturing method by growing a single crystal from a diamond single crystal seed substrate by vapor-phase synthesis, said method comprising etching away by reactive ion etching, prior to single crystal growth, at least 0.5 μm and less than 400 μm, in etching thickness, off a main face and at least 50 nm, in etching thickness, off outer peripheral side faces of the seed substrate which has been mechanically polished, and growing then a single crystal thereon.

2. The method according to claim 1, wherein an etching gas in said reactive ion etching is a mixture gas of oxygen and carbon fluoride.

3. The method according to claim 1, wherein an etching pressure in said reactive ion etching is at least 1.33 Pa and no more than 13.3 Pa.

4. The method according to claim 1, wherein the substrate temperature during etching in said reactive ion etching is 800K or less.

* * * * *